United States Patent [19]
Chatterjee et al.

[11] Patent Number: 6,111,414
[45] Date of Patent: Aug. 29, 2000

[54] SYSTEM, CIRCUIT, AND METHOD FOR TESTING AN INTERCONNECT IN A MULTI-CHIP SUBSTRATE

[75] Inventors: Abijit Chatterjee, Marietta, Ga.; Bruce Kim, Okemos, Mich.; Madhavan Swaminathan, Marietta, Ga.

[73] Assignee: Georgia Tech Research Corporation, Atlanta, Ga.

[21] Appl. No.: 09/126,909

[22] Filed: Jul. 31, 1998

Related U.S. Application Data

[60] Provisional application No. 60/054,288, Jul. 31, 1997.

[51] Int. Cl.[7] .................................................. G01B 7/14
[52] U.S. Cl. ............................................ 324/633; 324/652
[58] Field of Search ................................... 324/520, 521, 324/537, 633, 652

[56] References Cited

U.S. PATENT DOCUMENTS

| | | | |
|---|---|---|---|
| 2,320,175 | 5/1943 | Dennis et al. | 175/183 |
| 2,424,249 | 7/1947 | Miller | 175/183 |
| 2,431,339 | 11/1947 | McCool | 175/183 |
| 2,482,173 | 9/1949 | Hagstrum | 175/183 |
| 2,784,375 | 3/1957 | Mehlman | 324/57 |
| 3,631,336 | 12/1971 | Marvin | 324/652 |
| 3,763,399 | 10/1973 | Jenkins | 317/31 |
| 3,840,805 | 10/1974 | Martyashin et al. | 324/652 |
| 5,736,862 | 4/1998 | Hamblin | 324/527 |

OTHER PUBLICATIONS

Microelectronic (Sedra/Smith Fourth Editions) pp. 909–910 1993 (No Month Available).

Hopper, et al., "A Feasability Study for the Fabrication of Planar Silicon Multichip Modules Using Electron Beam Lithography for Precise Location and Interconnection of Chips," IEEE Transactions on Components, Hybrids, and Manufacturing Technology, vol. 15, No. 1, Feb. 1992, pp. 97–102.

Roszel, "MCM Test Methodologies and Project Experiences," ICEMCM 95, pp. 424–427.

Berke, et al., "Test Strategy for a Microprocessor Based Multi–Chip Module," ICEMCM 95, pp. 419–423 No Month Available.

Keezer, "Electronic Test Methods for Multichip Modules," Proceedings of the 8th Electronic Materials and Processing Congress, San Jose, California, Aug. 30–Sep. 2, 1993, pp. 131–137.

Keezer, "Fault Isolation Methods for Multichip Modules," ISTFA '93: The 19th International Symposium for Testing & Failure Analysis, Los Angeles, California, Nov. 15–19, 1993, pp. 135–141.

(List continued on next page.)

*Primary Examiner*—Safet Metjahic
*Assistant Examiner*—Vincent Q. Nguyen
*Attorney, Agent, or Firm*—Thomas, Kayden, Horstemeyer & Risley, L.L.P.

[57] ABSTRACT

A system for testing interconnects in multi-chip modules including a radio frequency resonator having a resonant circuit with a relatively high quality factor, the output of the resonant circuit being attached to a probe. Electrically coupled to the resonant circuit output is an apparatus to analyze the voltage signal output. The probe is applied to one end of an interconnect. When the probe is applied, the resonant frequency of the resonant circuit and the magnitude of the frequency response are altered due to the additional loading created by the interconnect. Due to the relatively high quality factor of the resonant circuit, the magnitude of the frequency response of the altered resonant circuit is measurably distinct from a predetermined reference magnitude at a predetermined reference frequency, thus indicating the existence of a defect. Additionally, the type of defect that exists is ascertainable by determining whether the resonant frequency of the altered resonant circuit is greater or less than the reference frequency by examining, for example, the phase response.

26 Claims, 9 Drawing Sheets

OTHER PUBLICATIONS

Brunner, et al., "Contactless Testing of Multi–Chip Modules," Microelectronic Engineering 24 (1994) 61–70 No Month Available.

Brunner, et al., "Electron–Beam MCM Testing and Probing," IEEE Transactions on Components, Packaging, and Manufacturing Technology–Part B: Advanced Packaging, vol. 17, No. 1, Feb. 1994, pp. 62–68.

Zorian, "A Structured Testability Approach for Multi–Chip Modules Based on BIST and Boundary Scan," IEEE Transactions on Components, Packaging, and Manufacturing Technology–Part B, vol. 17, No. 3, Aug. 1994.

Abadir, et al., "Analyzing Multichip Module Testing Strategies," IEEE Design and Test of Computers, Spring 1994, pp. 40–52 No Month Available.

Karpenske, et al., "Testing and Diagnosis of Multichip Modules," Solid State Technology, Jun. 1991, pp. 24–26.

Blood, et al., "Electrical Analysis of a Thin Film Multichip Module Substrate," IEEE 1992, pp. 138–141.

Shrivastava, "Design, Simulation Model and Measurements for High Density Interconnection," International Conference on Advances in Interconnection and Packaging (1990), vol. 1389, pp. 122–137 No Month Available.

Woodard, Sr., "High Density Interconnect Verification of Unpopulated Multichip Modules," 1991 Proceedings, Eleventh IEEE/CHMT International Electronics Manufacturing Technology (IEMT) Symposium, pp. 434–439 No Month Available.

Deutsch, et al., "Characterization of Resistive Transmission Lines by Short–Pulse Propagation," IEEE Microwave and Guided Wave Letters, vol. 2, No. 1, Jan. 1992, pp. 25–27.

Lipa, et al., "Experimental Characterization of Transmission Lines in Thin–Film Multichip Modules," IEEE Transactions on Components, Packaging, and Manufacturing Technology–Part A, vol. 19, No. 1, Mar. 1996.

Hayden, et al., "Characterization of Multiple Line Interconnection Structures from Time Domain Measurements," ISHM '93 Proceedings, pp. 622–625 No Month Available.

Wedwick, "Testing MLBs Continuity Testing by Capacitance," Circuits Manufacturing, Nov. 1974, pp. 58, 61.

Golladay, et al., "Electron–Beam Technology for Open/Short Testing of Multi–Chip Substrates," IBM J. Res. Develop., vol. 34, No. 2/3 Mar./May 1990, pp. 250–259.

Marshall, et al., "CAD–Based Net Capacitance Testing of Unpopulated MCM Substrates," IEEE Transactions on Components, Packaging and Manufacturing Technology–Part B: Advanced Packaging, vol. 17, No. 1, Feb. 1994.

Crnic, et al., "Electrical Test of Multi–Chip Substrates," ICEMM Proceedings '93, pp. 422–428 No Month Available.

Economikos, et al., Electrical Test of Multichip Substrates, IEEE Transactions on Components, Packaging, and Manufacturing Technology–Part B: Advanced Packaging, vol. 17, No. 1, Feb. 1994, pp. 56–61.

Ross, et al., "High Density Interconnect Verification Using Voltage Contract Electron Beam," IEEE/CHMT '91 IEMT Symposium, pp. 270–274 No Month Available.

Hamel, et al., "Capacitance Test Technique for the MCM of the 90s," Proceedings of the Technical Conference 1993 International Electronics Packaging Conference, Sep. 12–15, 1993, vol. 2, pp. 855–871.

SYSTEM, CIRCUIT, AND METHOD FOR TESTING AN INTERCONNECT IN A MULTI-CHIP SUBSTRATE

CROSS REFERENCE TO RELATED APPLICATIONS

This application claims the benefit of co-pending United States provisional patent application entitled "MCM Connect Test," filed on Jul. 31, 1997 and accorded Ser. No. 60/054,288, which is incorporated herein by reference in its entirety.

FIELD OF THE INVENTION

This invention relates to the field of testing of multi-chip modules, and, more particularly, to the testing of interconnects in multi-chip modules for defects.

BACKGROUND OF THE INVENTION

The use of multi-chip modules is becoming more and more common in the computer industry. A multi-chip module is an apparatus that allows the interconnection of several integrated circuits without the use of circuit boards with large footprints. Essentially, unpackaged integrated circuits are placed directly on a multi-chip module and pin connections are made using interconnects in the substrate.

Generally, the construction of a multi-chip module begins with a substrate with several connections on one side that can be described as input or output terminals. The input/output terminals may be either solder balls or pins. The terminals are in a grid formation on the substrate and extend through the substrate to metal pads on the other side. An insulating material, such as a polymide, is placed over the pins and various interconnections between pins are made. These interconnections undergo optical inspection for defects and are then typically covered by another insulating layer. Various connections are brought through this insulating layer and then further interconnections are made and, thereafter, optically inspected for defects. This process is generally repeated a number of times, a typical multi-chip module having up to 8 to 100 total insulating layers when completed. Thereafter, integrated circuits are placed on the multi-chip module at the appropriate interconnections. Interconnections through the various layers make up the chip-to-chip interconnects of the multi-chip module.

However, the above process of manufacturing multi-chip modules is not without its problems. Often times defects are overlooked during optical inspection. In addition, defects can occur in a layer after it is optically inspected while additional layers are being added to the multi-chip module.

Consequently, current methods are employed to try to detect any such defects that were missed or created during the manufacturing process when the multi-chip module is completed. One such method involves the use of a capacitive meter. Specifically, a meter probe is placed on one end of an interconnect and the capacitance with respect to ground is determined. However, a capacitive meter employed in this manner is limited by its resolution capability. In particular, such a meter may have difficulty measuring the capacitance of various discontinuities or "opens" in an interconnect.

Another method entails resistive testing. In this method two probes are placed on either end of an interconnect and an attempt is made to pass a current through the interconnect to detect a defect. This method has several problems, however, including difficulty in determining whether a short circuit or a "short" exists between two interconnects. In the case of a short, one may perform a time consuming search for an interconnect which is shorted with another interconnect by process of elimination. Also, the difficulty of synchronizing the placement of two probes onto various interconnects during resistive testing can be difficult and costly to achieve. Often times, testing of multi-chip modules combines both the capacitive and resistive tests, thereby translating into greater complexity, inspection time, and equipment cost.

Yet another method for testing an interconnect is the electron beam test. This test involves charging an interconnect with an electron beam. Thereafter, the interconnect is examined for the size of the charge to see whether leakage has occurred due to shorts or whether opens exist due to discontinuity of the charge through the entire interconnect. However, the cost of the equipment necessary to perform inspection using this method is so high as to be nearly prohibitive.

Finally, another method to determine a defect in an interconnect is by using time domain network analysis (TDNA). In TDNA, a probe is placed on either end of an interconnect and a pulse is propagated through the interconnect. The pulse is reflected from the far end of the interconnect and the reflection is detected. A defect may be determined depending on the time lapse between the pulse transmission and the receipt of the reflection. This method is inadequate as where a short exists, the pulse is ultimately transmitted through two interconnects and a search is necessary to find the interconnect to which the pulse is shorted. As a result, this method may be time consuming, and necessitates high frequency equipment to generate and receive the pulses which translates into significant and even prohibitive cost.

Consequently, there is a need for a testing system and method to test for defects in an multi-chip module that ensures reliable detection of all defects at a minimal cost.

SUMMARY OF THE INVENTION

The present invention involves a system and method for detecting defects in interconnects in a multi-chip module after the module is completed. According to the present invention, the system entails a radio frequency (RF) resonator having a resonant circuit with a relatively high quality factor. Electrically coupled to the resonant circuit is an apparatus to analyze the output. The output of the resonant circuit is applied to one end of an interconnect using a probe. When the probe is applied, the resonant frequency of the resonant circuit and the magnitude of the frequency response at the resonant frequency are altered due to the additional loading created by the interconnect. Due to the high quality factor of the resonant circuit, the magnitude of the frequency response of the altered resonant circuit is measurably distinct from a predetermined magnitude at a predetermined test frequency which are determined by calculation or by contacting the probe to an interconnect without defects. Additionally, the type of defect that exists is ascertainable by determining whether the resonant frequency of the altered resonant circuit is greater or less than the reference frequency as determined by the phase response of the altered resonant circuit.

The method according to the present invention involves the steps of generating a test signal in a radio frequency resonator to be applied to an interconnect to test for defects. Next, the step is performed of electrically coupling the resonant circuit to an interconnect to be tested for defects, thereby creating an altered resonant circuit having an altered frequency response. Finally, the step of determining the existence of a defect in the interconnect by comparing the magnitude of the altered frequency response at a predetermined test frequency to a predetermined threshold is performed. In addition, the step of determining the type of defect is performed in which the phase response is measured at two test frequencies to determine if the resonant frequency of the altered resonant circuit falls outside of a predetermined frequency window.

Other features and advantages of the present invention will become apparent to one with skill in the art upon examination of the following drawings and detailed description. It is intended that all such additional features and advantages be included herein within the scope of the present invention, as defined by the claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention. In the drawings, like reference numerals designate corresponding parts throughout the several views.

DETAILED DESCRIPTION OF THE PREFERRED EMBODIMENT

Figure 1:
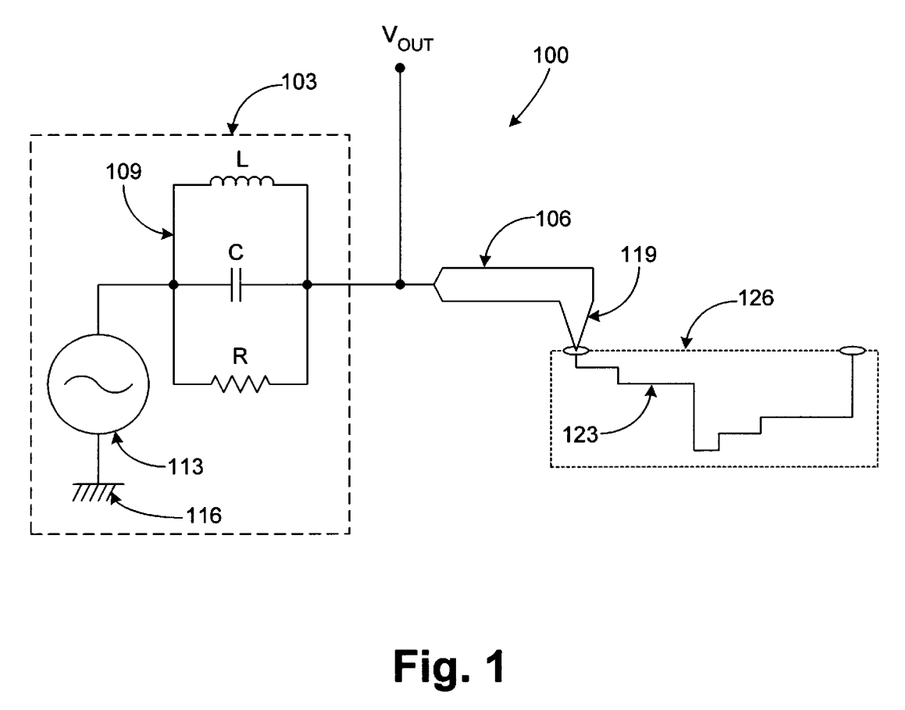
FIG. 1 is a schematic of a circuit using a resonant circuit and a probe for testing an interconnect according to the present invention.

Turning to FIG. 1, shown is a circuit 100 for detecting a defective interconnect in a multi-chip module (MCM). The circuit 100 includes a radio frequency (RF) resonator 103 which is electrically coupled to a probe 106. The RF resonator 103 features a parallel resonant circuit 109 with an inductance L, a capacitance C, and a resistance R. Note that a series resonant circuit may be employed in place of the parallel resonant circuit 109. The parallel resonant circuit 109 is electrically coupled to a radio frequency (RF) power source 113 which excites the parallel resonant circuit 109. The RF power source 113 is, in turn, coupled to ground 116. The probe 103 includes a contact point 119 which establishes electrical contact with an end of an interconnect 123 in a multi-chip module 126. A voltage output VOUT is electrically connected to the probe 106.

Figure 2:
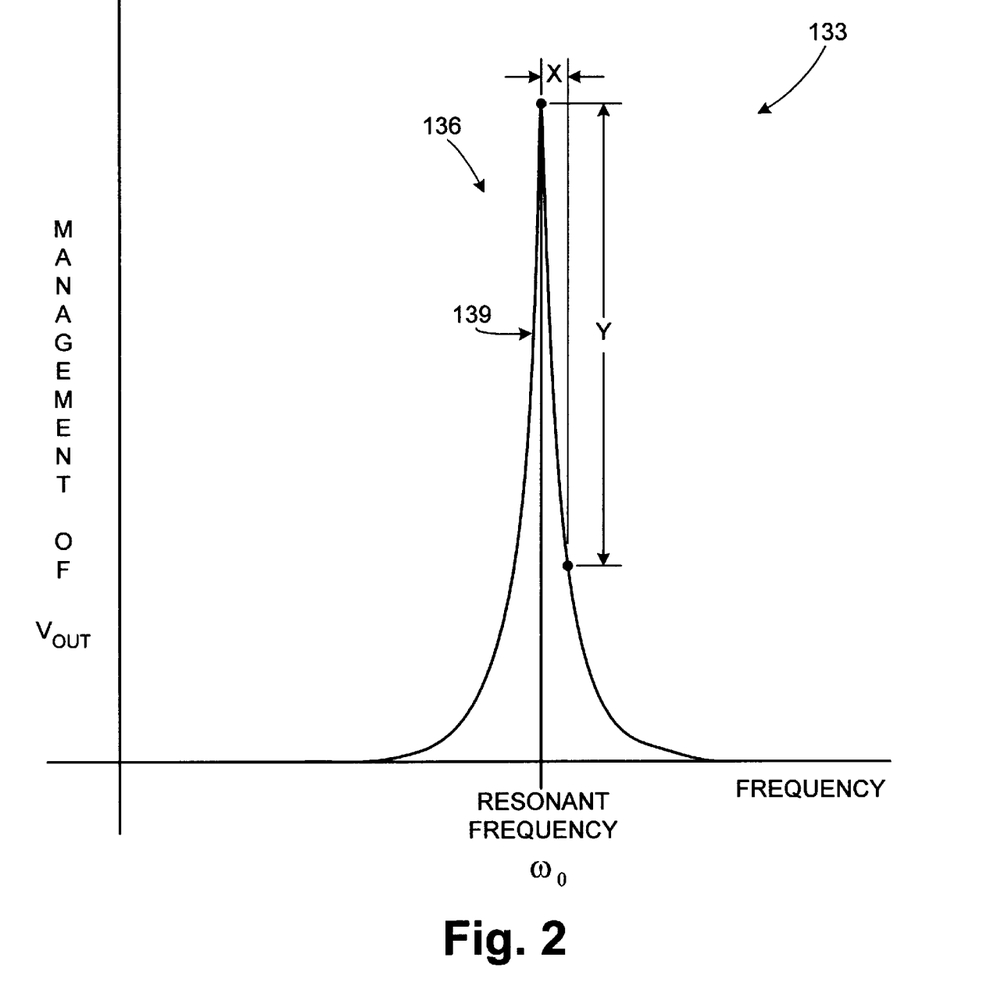
FIG. 2 is a graph of the frequency response of the resonant circuit of FIG. 1.

Turning now to FIG. 2, shown is a graph of the frequency response 133 of the magnitude of the voltage output $V_{OUT}$ of the resonant circuit 109 (FIG. 1) when the probe 106 (FIG. 1) is not in contact with an interconnect 123 (FIG. 1). The resonant circuit 109 is advantageously designed to have a high quality factor resulting in a very narrow peak 136 in the output voltage at the resonant frequency $\omega_0$ of the resonant circuit 109. The quality factor of a resonant circuit is defined as the ratio of the resonant frequency $\omega_0$ to the bandwidth of the resonant circuit. The resonant circuit 109 is designed to have a quality factor such that the sides 139 of the peak 136 in the resonant circuit output at the resonant frequency $\omega_0$ have a steep slope. That is to say, very small changes in X along the sides 139 correspond to very large changes in Y as shown in FIG. 2.

Figure 3:
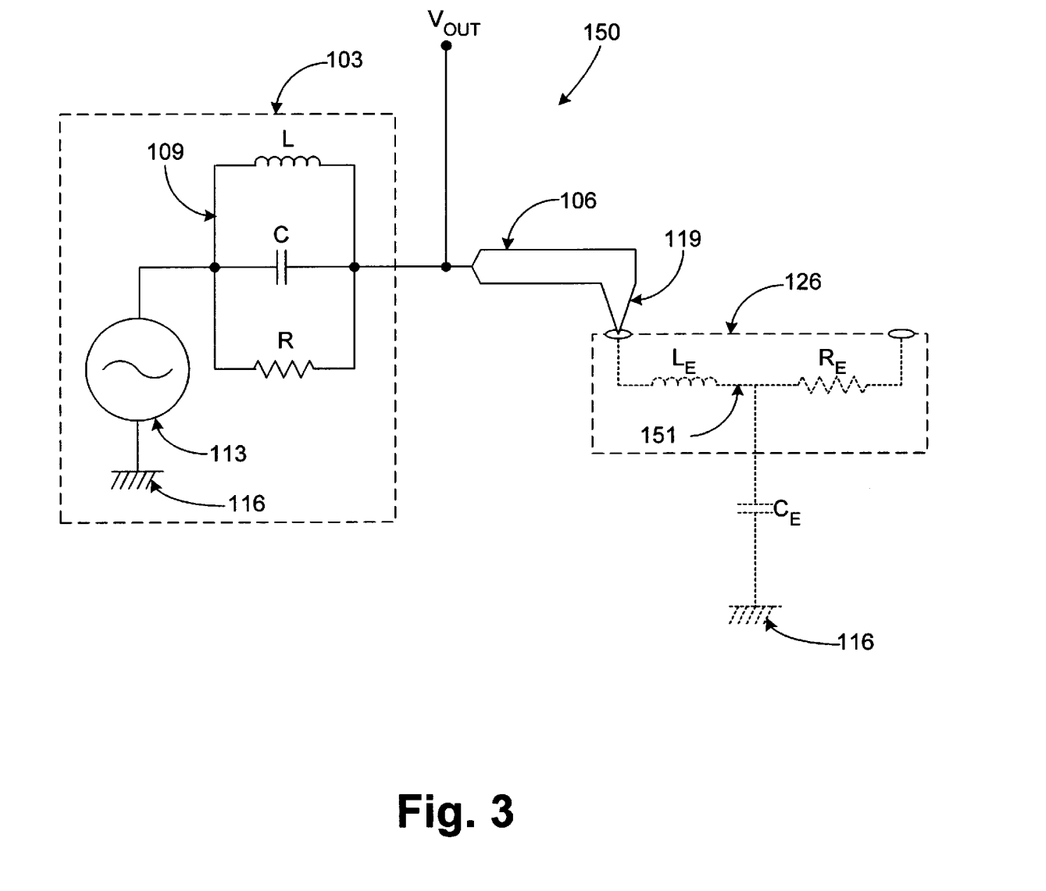
FIG. 3 is a schematic of an equivalent circuit when the circuit of FIG. 1 is applied to an interconnect through a probe.

Referring to FIG. 3, shown is an equivalent circuit 150 to the circuit 100 when the probe 106 (FIG. 1) is in contact with the interconnect 123 (FIG. 1). The interconnect 123 acts as an equivalent circuit 151 with an equivalent inductance LE, an equivalent resistance $R_E$, and an equivalent capacitance $C_E$ with respect to ground 116 as shown. When the probe is placed in electrical contact with the interconnect 123, a change in the frequency response of the resonant circuit 109 results due to the loading of the resonant circuit 109 by the equivalent inductance $L_E$, equivalent resistance $R_E$, and equivalent capacitance $C_E$ of the interconnect 123. This change in the frequency response includes an altered resonant frequency and an altered magnitude at the resonant frequency.

Figure 4A:
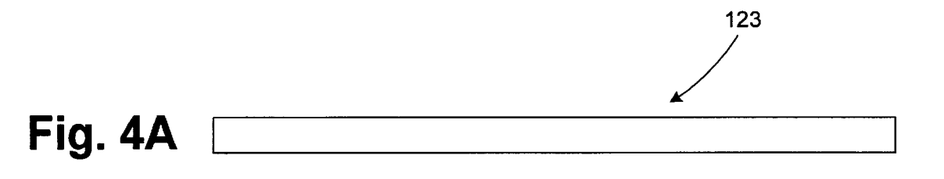
FIG. 4A is a drawing showing a defect free interconnect.
Figures 4B, 4C:
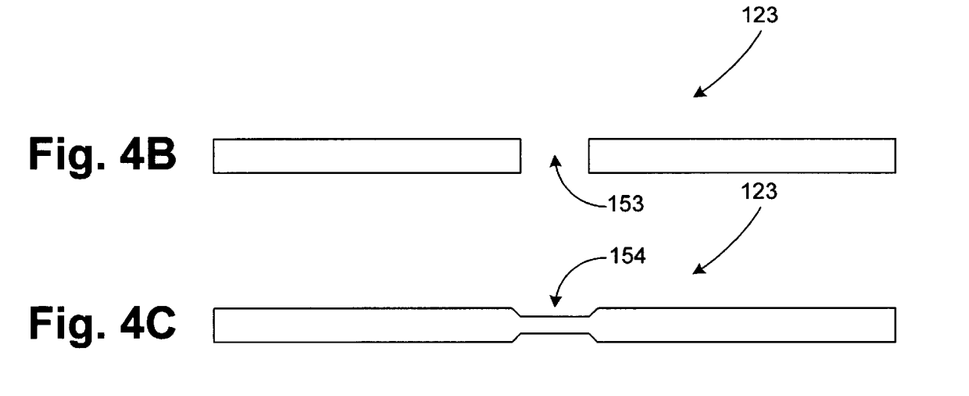
FIG. 4B is a drawing showing an open defect in an interconnect.
FIG. 4C is a drawing showing a near open defect in an interconnect.
Figure 4D:
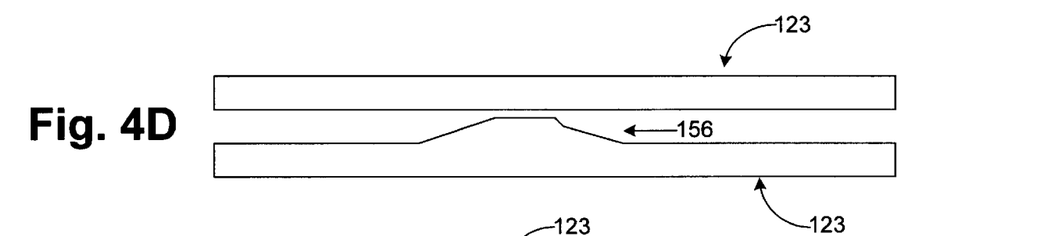
FIG. 4D is a drawing showing a near short defect in an interconnect.
Figure 4E:
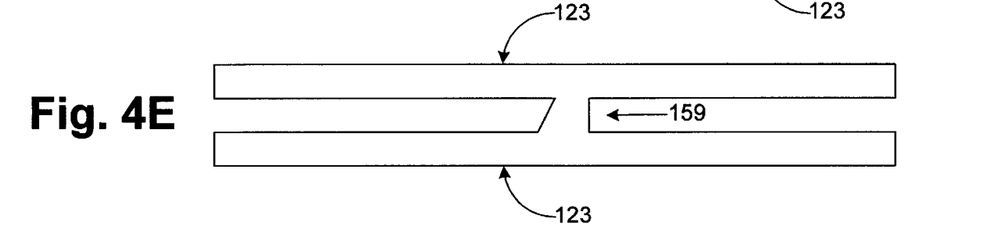
FIG. 4E is a drawing showing a short defect in an interconnect.

Referring now to FIGS. 4A–4E, before discussion of the nature of the shift of the resonant frequency of the RF resonator 103 due to the electrical contact of the probe 106 onto the interconnect 123, a description of the various possible conditions the interconnect 123 which may affect the precise shift of the resonant frequency is provided. FIG. 4A shows an interconnect 123 free of defects. FIG. 4B shows an interconnect 123 with a complete break or open 153. FIG. 4C shows an interconnect 123 with a near open 154. FIG. 4D shows a pair of interconnects 123 with a near short 156 between them. The near short 156 establishes a capacitive link between the pair of interconnects 123. Finally, FIG. 4E shows a pair of interconnects 123 electrically connected by a short 159. Any of the defects shown in FIGS. 4B–4E may occur during the manufacturing of a multi-chip module.

Figure 5:
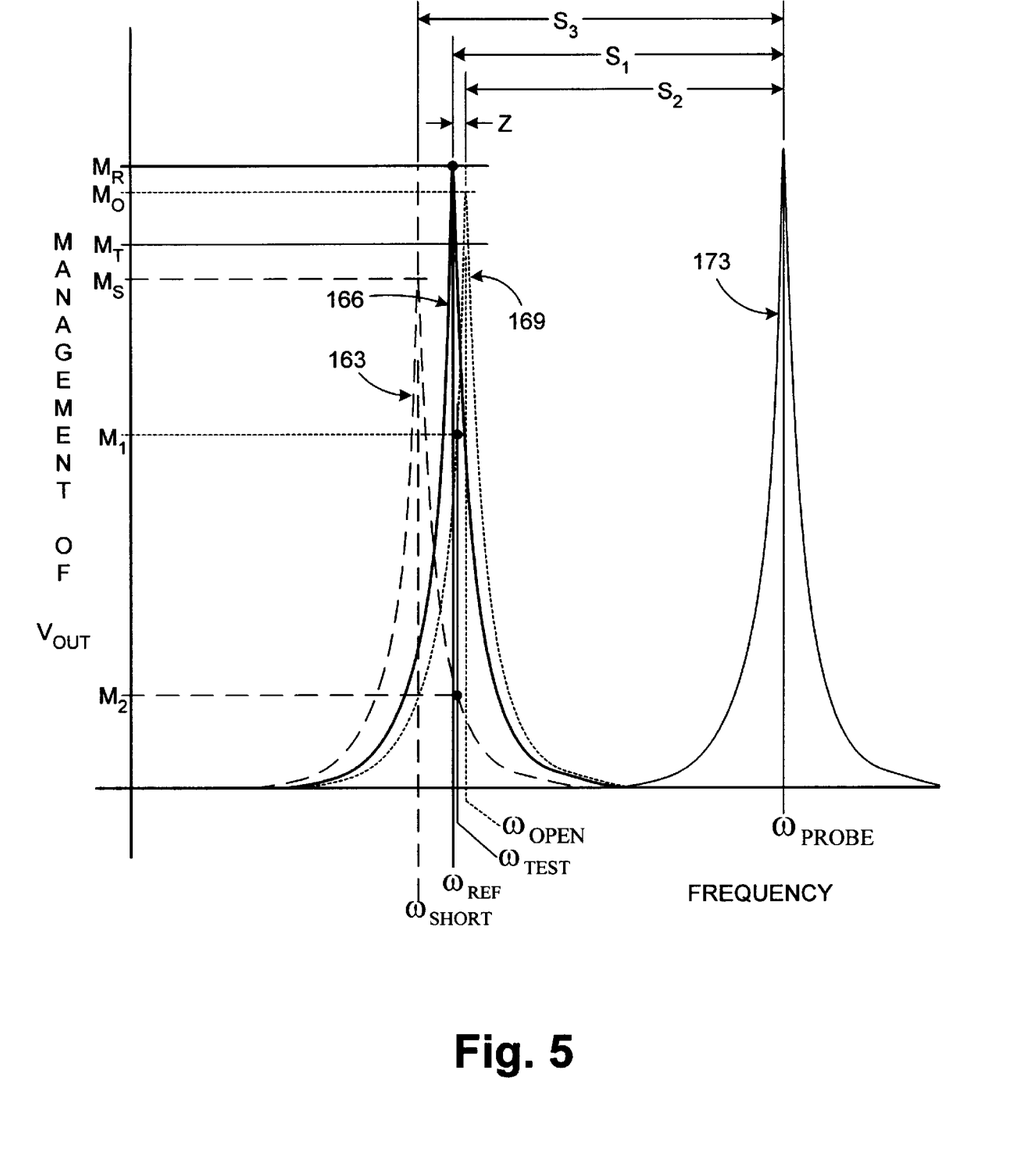
FIG. 5 is a graph showing the frequency responses of the resonant circuit of FIG. 1 when the probe is applied to interconnects having various defect states.

Turning to FIG. 5, shown is a graph of the frequency responses of the circuit 100 (FIG. 1) with the probe 106 (FIG. 1) in electrical contact with interconnects 123 (FIG. 1) with or without various defects. The graph shows four different peaks. Starting from the left, the first is a short peak 163, the second is a defect free peak 166, the third is an open defect peak 169, and the fourth is a freestanding probe peak 173. It should be noted that these peaks are not produced concurrently, but exist individually depending on the frequency response of the circuit 100 during the various states of operation. The explanation of each of these peaks begins with the freestanding probe peak 173 which is the frequency response of the circuit 100, particularly the resonant circuit 109, when the probe 106 is not in electrical contact with an interconnect 123 and is freestanding. The freestanding probe center frequency $\omega_{PROBE}$ is the resonant frequency of the circuit 100 in this state.

The defect free peak 166 is the frequency response of the circuit 100 when the probe 106 is applied to an interconnect 123 which is free of defects. In a sense, when the probe 106 is applied to the interconnect 123 free of defects, the resonant circuit 109 (FIG. 1) is modulated by the frequency response of the equivalent inductance $L_E$ (FIG. 3), equivalent resistance $R_E$ (FIG. 3), and equivalent capacitance $C_E$ (FIG. 3) of the defect free interconnect 123 resulting in a resonant frequency of the circuit 100 that is shifted down by $S_1$ and centered at a reference frequency $\omega_{REF}$ with a magnitude of $M_R$. The reference frequency $\omega_{REF}$ is important due to its use in further measurements as will be discussed.

The open defect peak 169 is centered at the open center frequency $\omega_{OPEN}$ with a magnitude $M_O$ and is the frequency response of the circuit 100 when the probe 106 is applied to an interconnect 123 with an open 153 (FIG. 4B) or near open 154 (FIG. 4C). When the probe 106 is applied to an interconnect 123 with an open 153 or near open 154, the resonant circuit 109 (FIG. 1) is altered by the equivalent circuit 151 presented by the interconnect 123 resulting in a resonant frequency that is shifted down by $S_2$. Generally, the frequency shift of $S_2$ is less than $S_1$ as will be discussed.

The short peak 163 is centered at the short center frequency $\omega_{SHORT}$ with a magnitude $M_S$ and is the frequency response of the circuit 100 when the probe 106 is applied to an interconnect 123 with a near short 156 (FIG. 4D) or a short 159 (FIG. 4E). When the probe 106 is applied to an interconnect 123 with an near short 156 or a short 159, the resonant circuit 109 (FIG. 1) is altered by the equivalent circuit 151 presented by the interconnect 123 resulting in a resonant frequency that is shifted down by $S_3$. The shift $S_3$ is generally greater than the shift $S_1$ as will be discussed.

As previously stated, the quality factor of the RF resonator 103 is chosen so that the peak at the resonant frequency is both steep and narrow. This means a very small shift in either the positive or negative direction along the frequency axis results in a measurable corresponding change in the magnitude as measured at a fixed test frequency $\omega_{TEST}$. To explain further, according to the present invention, first a reference frequency $\omega_{REF}$ is established by applying the probe 106 to an interconnect 123 that is free of defects and then determining the center frequency of the resulting peak. The reference frequency $\omega_{REF}$ may also be calculated mathematically using a transfer function of the total system. Once the reference frequency $\omega_{REF}$ is established, a test frequency $\omega_{TEST}$ is determined by choosing a frequency close to the reference frequency $\omega_{REF}$. Ideally, the reference frequency $\omega_{REF}$ should be used as the test frequency $\omega_{TEST}$, however, this is impractical as it is a pole frequency. The test frequency $\omega_{TEST}$ may be, for example, a point on the resulting peak centered at the reference frequency $\omega_{REF}$ that is 3 decibels down from the peak magnitude at the reference frequency $\omega_{REF}$. Of primary importance is that the test frequency $\omega_{TEST}$ be located generally close to the reference frequency $\omega_{REF}$ for future measurement, rather than pinpointing the precise value of the test frequency $\omega_{TEST}$. Another concern is to find a frequency for the test frequency $\omega_{TEST}$ that is easily measured.

Once the test frequency $\omega_{TEST}$ is established, the same interconnect 123 from which the test frequency $\omega_{TEST}$ is derived is tested in different multi-chip modules by the application of the probe 106. Given that the later tested interconnects 123 are the same as the interconnect measured to obtain the test frequency $\omega_{TEST}$, then the resonant frequency of the RF resonator 103 should experience a shift that places the center frequency at or very close to the reference frequency $\omega_{REF}$ with a similar magnitude. 1 5 However, if defects exist in the later interconnect 123 tested, the resonant frequency of the RF resonator 103 is not shifted down to the reference frequency $\omega_{REF}$ and generally, the magnitude of the response at this resonant frequency is not the same as the magnitude $M_R$ at the reference frequency $\omega_{REF}$ of the defect free peak 166. Rather, the resonant frequency experiences a frequency shift that is slightly less than or greater than the frequency shift which results in resonance at the reference frequency $\omega_{REF}$ with a different magnitude due to the different loading of the resonant circuit 109 (FIG. 3) by the addition of the defective interconnect 123 into the circuit.

The present invention facilitates the detection of the slightly lesser or greater frequency shift and a different peak magnitude resulting from the application of the probe 106 to a defective interconnect 123 by specifying the quality factor of the resonant circuit 109 of the RF resonator 103 in a particular manner. To explain further, the quality factor of the resonant circuit 109 is specified so that when the magnitude of the output $V_{OUT}$ of the circuit 100 when the probe 106 is applied to a defective interconnect 123 is measured at the test frequency $\omega_{TEST}$, a measurable difference in the magnitude as compared with MR results. It is advantageous that this result occurs even if the resonant frequency and magnitude of the circuit 100, as applied to the defective interconnect, differs from the test frequency $\omega_{TEST}$ and magnitude $M_R$ by a relatively small amount.

Take for example, as shown in FIG. 5, the case where an interconnect 123 with an open 153 is tested resulting in a shift of the resonant frequency of the RF resonator 103 similar to $S_2$. Note that even though the open center frequency $\omega_{OPEN}$ differs from the reference frequency $\omega_{REF}$ by a small amount Z, the magnitude $M_1$ measured at the test frequency $\omega_{TEST}$ of the frequency response differs from the reference magnitude $M_R$ by a great amount due to the dramatic slope of the side 139 (FIG. 2) of the peak as previously discussed. Similarly, the magnitude $M_2$ of the short peak 163 as measured at the test frequency $\omega_{TEST}$ is much lower than the magnitude $M_R$ even though the short center frequency $\omega_{SHORT}$ is only slightly less than the test frequency $\omega_{TEST}$.

Thus, according to the present invention, a benchmark for the quality factor of the resonant circuit 109 is that it should be sufficiently great that it results in a peak with slopes that are steep enough so that a shift in the resonant frequency of the resonant circuit 109 and the resulting change in the magnitude of the frequency response due to the application of the probe 106 to a defective interconnect 123 results in a measurable difference in magnitude of the frequency response at the test frequency $\omega_{TEST}$ as compared to the reference magnitude $M_R$. A desirable quality factor is one that is easily achievable given physical limitations of resonant circuits that allows the such defect detection.

According to the present invention then, using a resonant circuit 109 with a sufficient quality factor allows the detection of a defective interconnect 123 by comparing the magnitude of the frequency response of the circuit 100 at the test frequency $\omega_{TEST}$ with a predetermined magnitude threshold $M_T$. A defective interconnect 123 exists when, upon application of the probe 106 to the interconnect, the magnitude at the test frequency $\omega_{TEST}$ is lower than a predetermined magnitude threshold $M_T$. Additionally, one might subtract the magnitude of the frequency response from the magnitude $M_R$ to establish a magnitude differential. The magnitude differential can then be compared to a predetermined differential threshold to determine whether the interconnect 123 being tested is defective.

In addition to the determination of whether a defect exists in an interconnect 123, an advantage of the present invention is a greater defect resolution. The defect resolution allows the severity of a defect to be determined above the threshold of noise and general process variations. The severity of a defect refers to, for example, how narrow a near-open defect (FIG. 4C) may be or the proximity of a near short (FIG. 4D). Also, the location of such defects on the interconnect 123 will effect the frequency and phase response. The magnitude of the frequency response measured at the test frequency $\omega_{TEST}$ of particular defects can be measured or calculated and stored in a lookup table. The frequency response of later measured interconnects 123 can be compared to and matched with the frequency responses stored in the lookup table to determine the severity of the defect if any. With the severity of the defect known, a reliable decision may be made whether to repair the defect.

Figure 6:
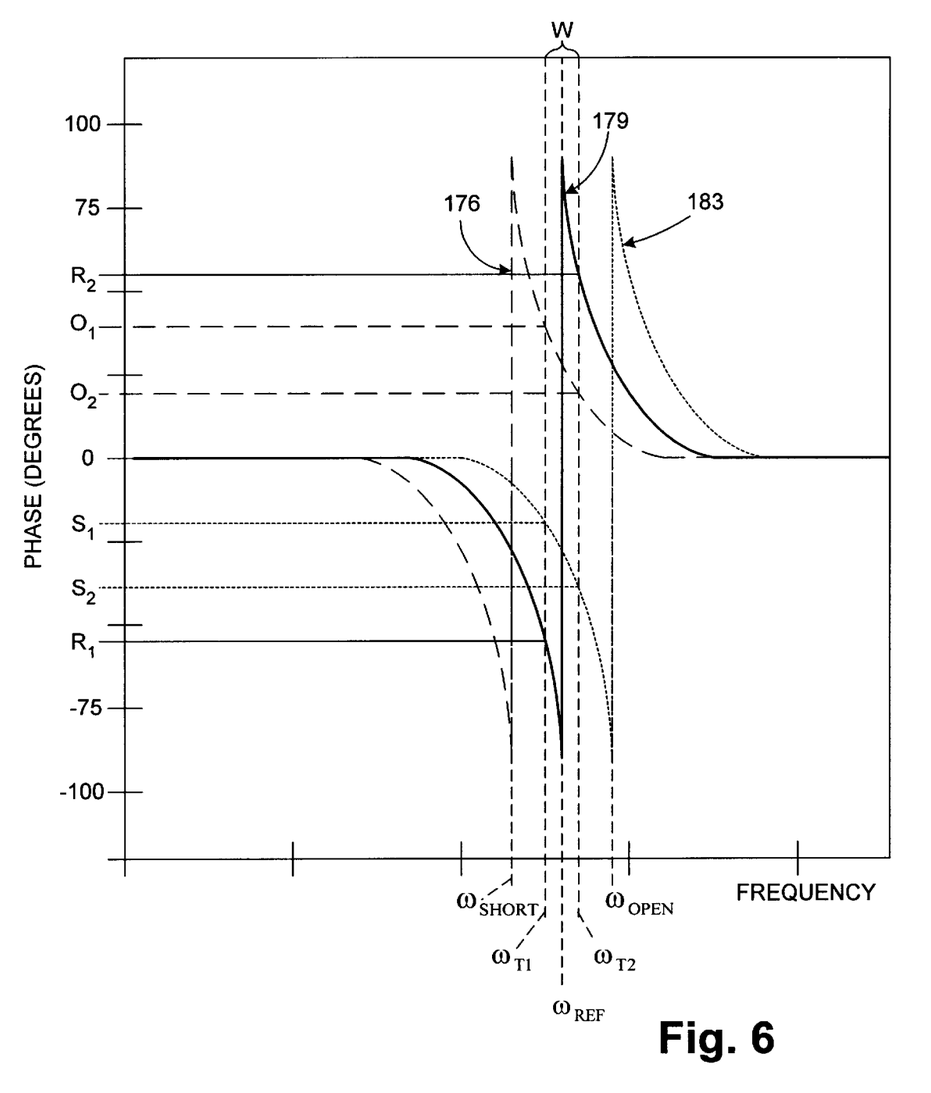
FIG. 6 is a graph showing the phase response of the resonant circuit of FIG. 1 when the probe is applied to interconnects having various defect states.

Once the presence of a defect is determined as discussed above, it may be desirable to determine the defect type. The present invention advantageously provides a simple approach for determining the precise type of defect present, whether it be an open 153 (FIG. 4B), near open 154 (FIG. 4C), short 159 (FIG. 4E), or near short 156 (FIG. 4D). Turning then, to FIG. 6, shown is the phase response of the resonant circuit 109 (FIG. 1) with the probe 106 (FIG. 1) in various states of contact with interconnects 123 (FIG. 1) having specific types of defects. In particular, shown are a short phase response 176, a reference phase response 179, and an open phase response 183. Note that the phase responses 176, 179, and 183 have a sharp 180° transition at the resonant frequencies $\omega_{SHORT}$, $\omega_{REF}$, and $\omega_{OPEN}$.

According to the present invention, a first phase test frequency $\omega_{T1}$ and a second phase test frequency $\omega_{T2}$ are defined on either side of the reference frequency $\omega_{REF}$. The first and second phase test frequencies frequency $\omega_{T1}$ and $\omega_{T2}$ define a phase test window W. When the reference phase response 179 is measured at the first phase test frequency $\omega_{T1}$. the phase is negative. Conversely, when the reference phase response 179 is measured at the second phase test frequency $\omega_{T2}$, the phase is positive. This is because the 180° transition falls between the first and second phase test frequencies $\omega_{T1}$ and $\omega_{T2}$. In the case of the short phase response 176, the phase is positive at both the first and second phase test frequencies $\omega_{T1}$ and $\omega_{T2}$. The open phase response 183 is negative at both the first and second phase test frequencies $\omega_{T1}$ and $\omega_{T2}$.

The foregoing provides a ready approach to determine the type of defect that exists in an interconnect. In order to determine the type of defect in an interconnect, the probe 106 (FIG. 1) is applied to the defective interconnect 123 and the phase response of the circuit 100 (FIG. 1) is measured at both the first and second phase test frequencies $\omega_{T1}$ and $\omega_{T2}$. Where the phase response is negative at both the first and second phase test frequencies $\omega_{T1}$ and $\omega_{T2}$, the defect is an open 153 or near open 154. Where the phase response is positive at both the first and second phase test frequencies $\omega_{T1}$ and $\omega_{T2}$ the defect is a short 159 or near short 156. In this manner, the type of defect which exists can be determined and a decision made as to whether to attempt to fix the flaw.

Another method of determining the type of defect that exists simply involves the steps of determining the resonant frequency $\omega_{SHORT}$ or $\omega_{OPEN}$ of the resonant circuit 109 when the probe 106 is applied to a defective interconnect 123 and comparing the resonant frequency $\omega_{SHORT}$ or Co OPEN with the reference frequency $\omega_{REF}$. Rather than examining the phase of the resonant circuit 109 when the probe 106 is applied to an interconnect 123, the actual placement of the resonant frequency relative to the reference frequency $\omega_{REF}$ is examined. If the resonant frequency falls to the left of the reference frequency $\omega_{REF}$, then the defect is a short 159 or near short 156. If the resonant frequency falls to the right of the reference frequency $\omega_{REF}$, then the defect is an open 153 or near open 154.

Figure 7:
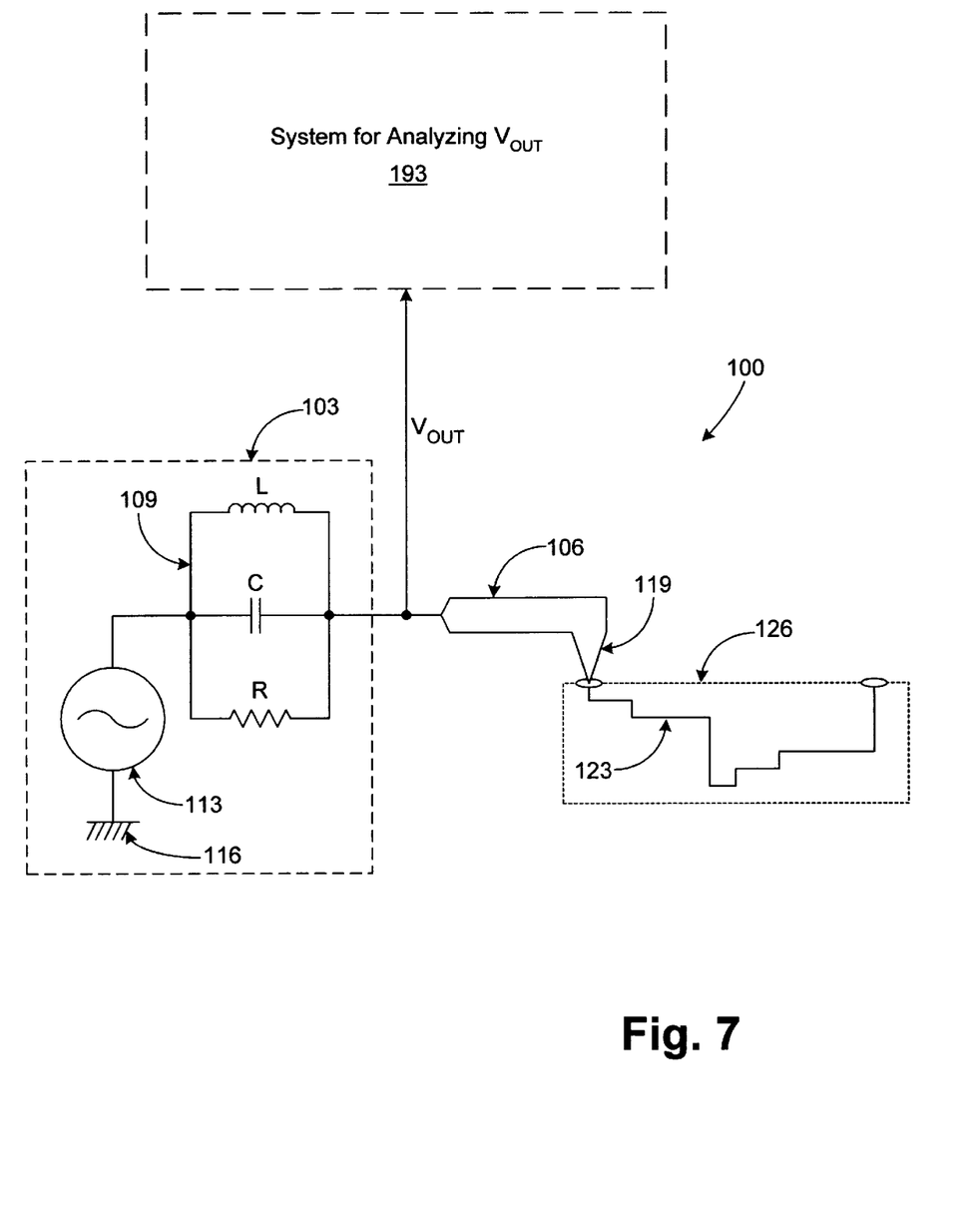
FIG. 7 is a block diagram showing a system for analyzing the output of the resonant circuit of FIG. 1 to ascertain the existence of and type of defect in an interconnect.

Referring next to FIG. 7, shown is the circuit 100 with the output $V_{OUT}$ being sent to a system 193. The system 193 receives $V_{OUT}$ and determines whether a defect exists and, what type of defect exists as previously discussed with respect to FIG. 6. The system 193 may be a simple circuit which compares $V_{OUT}$ to a predetermined voltage threshold when the probe 106 is applied to the interconnect 123 to determine whether a defect exists. Such a circuit could be described as a go-nogo test.

The system 193 may also entail the use of a phase locked loop which zeros in on the resonant frequency of the resonant circuit when the probe 106 is applied to the interconnect 123. The frequency of the output of the phase locked loop is compared to the reference frequency $\omega_{REF}$ and the existence of any defect, as well as the defect type are determined in the manner described above. Note that the system 193 may entail the use of a network analyzer or impedance analyzer as well.

Figure 8:
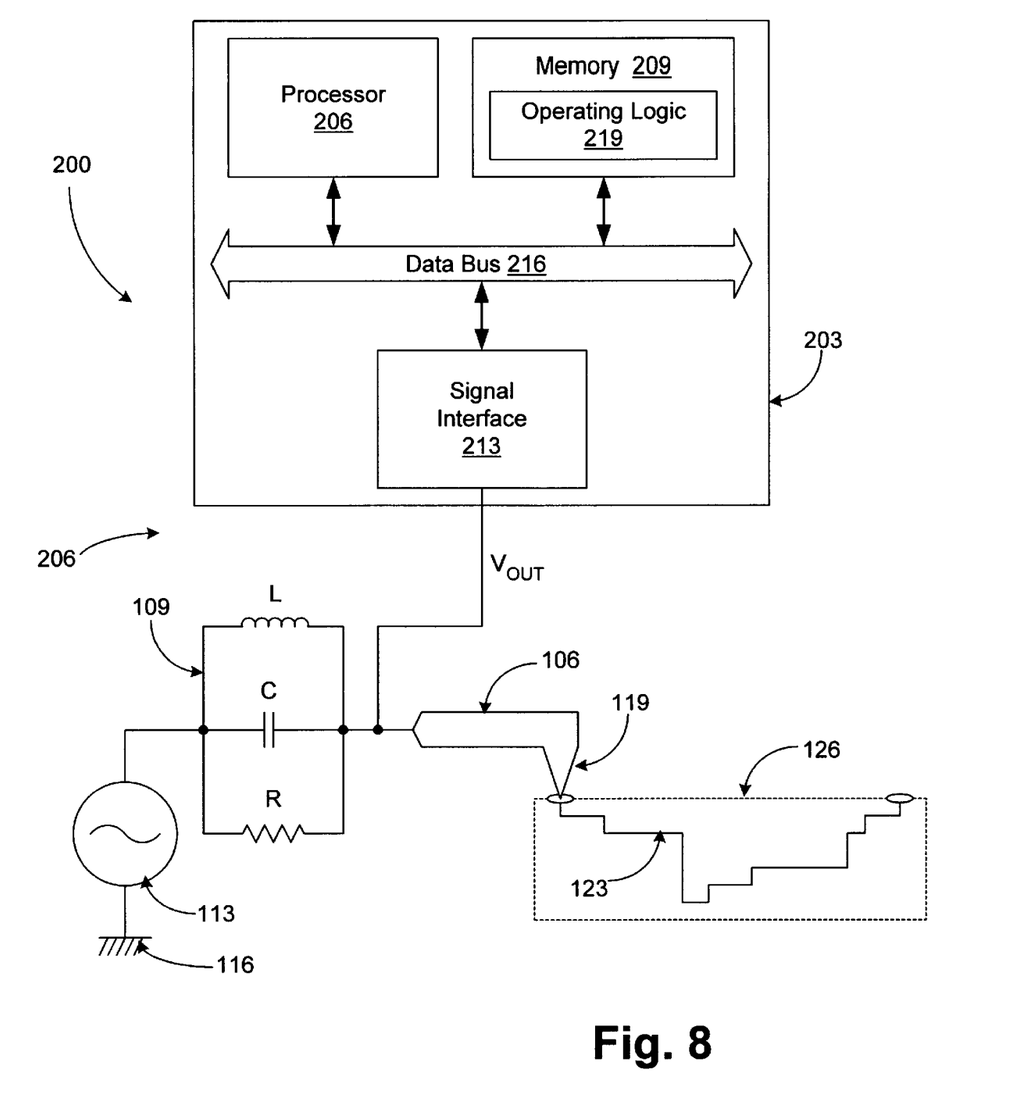
FIG. 8 is a block diagram showing a system for analyzing the output of the resonant circuit of FIG. 1 to ascertain the existence of and type of defect in an interconnect using a computer system.

Turning to FIG. 8, shown is a computer system 200 which is employed to detect the existence and type of defect in the interconnect 123 from the output $V_{OUT}$. The computer system 200 includes a computer 203. The computer 203 comprises a processor 206, a memory 209, and a signal interface 213. The processor 206, memory 209, and signal interface 213 are all electrically coupled to a common data bus 216. During operation, the processor 206 executes the operating logic 219 stored in the memory 209. The output $V_{OUT}$ is electrically coupled to the computer system 200 through the signal interface 213.

Figure 9:
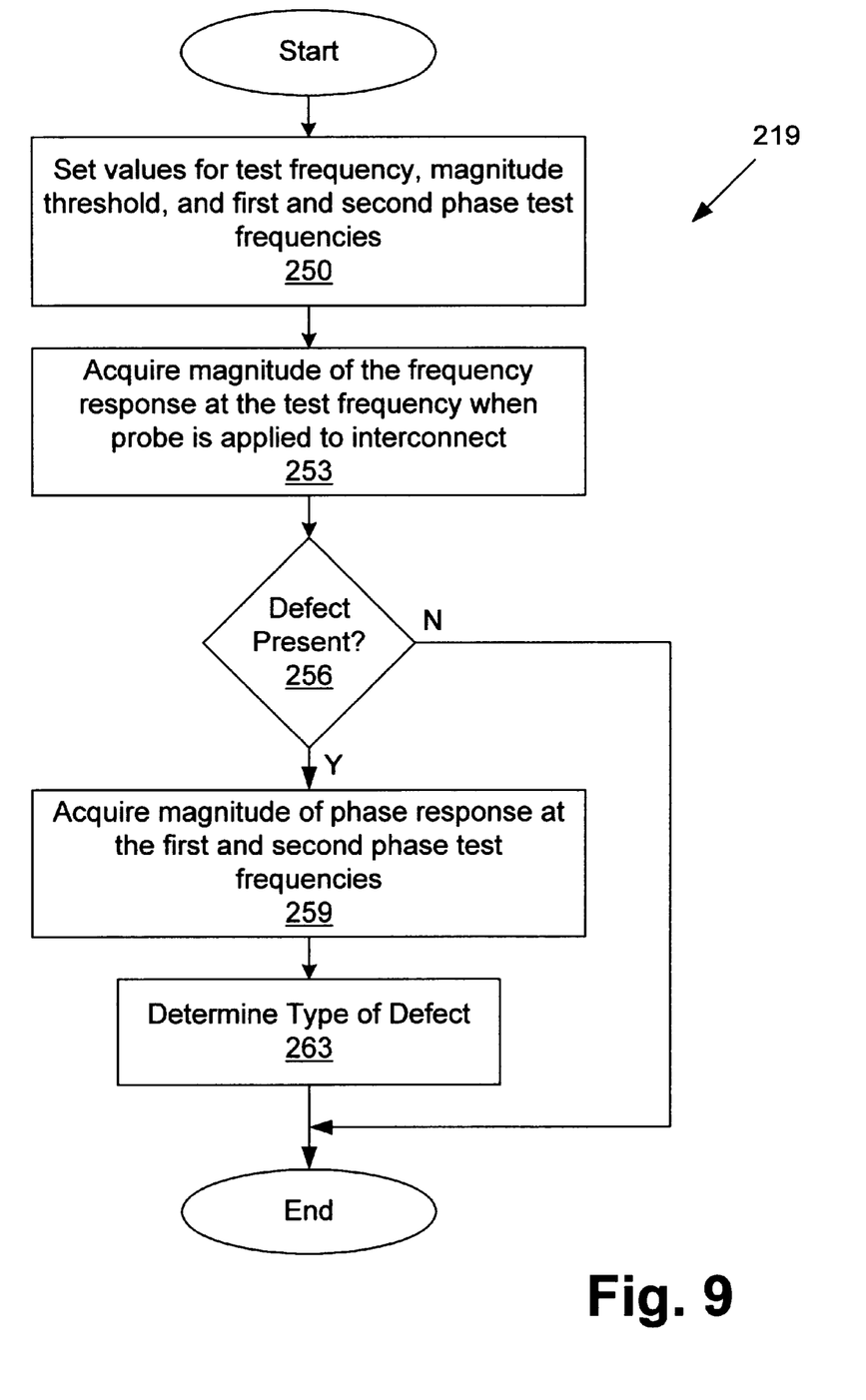
FIG. 9 is a flow chart showing the operating logic executed by the computer system of FIG. 8.

Referring, finally, to FIG. 9, shown is a flow chart detailing the operating logic 219 (FIG. 8) stored in the memory 209 (FIG. 8). The operating logic begins in block 250 where values for the test frequency $\omega_{TEST}$ (FIG. 5) frequency response magnitude threshold, and the first or second phase test frequencies $\omega_{T1}$ and $\omega_{T2}$ (FIG. 6) are preset. Both the test frequency and frequency response magnitude threshold may be determined by calculation or by testing an interconnect 123 (FIG. 1) free of defects as outlined above. The first and second phase test frequencies $\omega_{T1}$ and $\omega_{T2}$ are determined based on the test frequency $\omega_{TEST}$, depending on how wide the phase test window W (FIG. 6) is set. Next, in block 253, when the probe 106 (FIG. 1) is applied to an interconnect 123 to be tested, the magnitude of the frequency response is acquired at the test frequency. In block 256, the magnitude of the frequency response is measured against the preset magnitude threshold to determine if a defect exists as discussed previously. If it is determined that a defect does not exist, then the test reverts to the end and the system is readied to test another interconnect. If it is determined that a defect does exist, then the operating logic 219 progresses to block 259 where the magnitude of the phase response at the first and second phase test frequencies $\omega_{T1}$ and $\omega_{T2}$ is determined to ascertain the type of defect. In block 263, the type of defect is determined from the magnitudes of the phase response at the first and second phase test frequencies $\omega_{T1}$ and $\omega_{T2}$. In particular, if both the first and second phase test frequencies $\omega_{T1}$ and $\omega_{T2}$ are negative, then the defect is an open 153 (FIG. 4B) or near open 154 (FIG. 4C). If both the first and second phase test frequencies $\omega_{T1}$ and $\omega_{T2}$ are positive, then the defect is a near short 156 (FIG. 4D) or a short 159 (FIG. 4E) as previously discussed.

Many variations and modifications may be made to the embodiments of the invention discussed above without departing from the spirit and principles of the invention. All such modifications and variations are intended to be included herein within the scope of the present invention, as defined by the following claims.

What is claimed is:

1. A circuit for generating an output signal used to detect a defect in an interconnect in a multi-chip module (MCM), comprising:
   a resonant circuit having a predetermined resonant frequency;
   a probe attached to an output of the resonant circuit, the probe being configured to be applied to an interconnect for testing; and
   wherein the resonant circuit has a quality factor of sufficient magnitude to create a measurable difference between a magnitude of the output of the resonant circuit at a predetermined reference frequency when the probe is applied to a defective interconnect, and the magnitude of the output of the resonant circuit at the predetermined reference frequency when the probe is applied to a defect free interconnect.

2. The circuit of claim 1, wherein the resonant circuit further comprises:
   a parallel circuit having a resistor, a capacitor, and an inductor; and
   a power source electrically coupled to the parallel circuit.

3. The circuit of claim 1, wherein the resonant circuit further comprises:
   a series circuit having a resistor, a capacitor, and an inductor; and
   a power source electrically coupled to the series circuit.

4. The circuit of claim 1, further comprising a phase locked loop electrically coupled to the output of the resonant circuit.

5. The circuit of claim 1, further comprising a circuit electrically coupled to the output of the resonant circuit, the circuit being configured to compare the output of the resonant circuit with a predetermined threshold when the probe is applied to the interconnect to detect a defect therein.

6. The circuit of claim 1, further comprising:
   a processor circuit electrically coupled to the output of the resonant circuit, the processor circuit comprising a processor and a memory; and
   operating logic stored in the memory and executable by the processor, the operating logic comprising logic to determine an existence of a defect in the interconnect.

7. The circuit of claim 6, wherein the operating logic further comprises logic to determine a type of defect in the interconnect.

8. The circuit of claim 6, wherein the logic to determine an existence of a defect in the interconnect further comprises:
   logic to acquire the magnitude of the output of the resonant circuit at the predetermined reference frequency when the probe is applied to the interconnect; and
   logic to compare the magnitude of the output of the resonant circuit with a predetermined magnitude threshold.

9. The circuit of claim 8, wherein the logic to determine a type of defect in the interconnect further comprises:
   logic to acquire a first measurement of a phase response of the resonant circuit at a first frequency;
   logic to acquire a second measurement of the phase response of the resonant circuit at a second frequency; and
   logic to determine the type of defect in the interconnect based upon the first and second measurements.

10. A circuit for generating an output signal used to detect a defect in an interconnect in a multi-chip module (MCM), comprising:
    a resonant circuit having a predetermined resonant frequency;
    a probe attached to an output of the resonant circuit, the probe being configured to be applied to an interconnect for testing; and
    wherein the resonant circuit has a quality factor of a sufficient magnitude to create a measurable difference between a phase response of the resonant circuit at a predetermined reference frequency when the probe is applied to a defective interconnect, and the phase response of the resonant circuit at the predetermined reference frequency when the probe is applied to a defect free interconnect.

11. The circuit of claim 10, further comprising a circuit electrically coupled to the output of the resonant circuit, the circuit being configured to determine a type of defect in the interconnect.

12. The circuit of claim 10, wherein the resonant circuit further comprises:
    a parallel circuit having a resistor, a capacitor, and an inductor; and
    a power source electrically coupled to the parallel circuit.

13. The circuit of claim 10, wherein the resonant circuit further comprises:
    a series circuit having a resistor, a capacitor, and an inductor; and
    a power source electrically coupled to the series circuit.

14. The circuit of claim 10, further comprising:
    a processor circuit electrically coupled to the output of the resonant circuit, the processor circuit comprising a processor and a memory; and
    operating logic stored in the memory and executable by the processor, the operating logic comprising logic to determine a type of defect in the interconnect.

15. The circuit of claim 14, wherein the logic to determine a type of defect in the interconnect further comprises:
    logic to acquire a first measurement of the phase response of the resonant circuit at a first frequency;
    logic to acquire a second measurement of the phase response of the resonant circuit at a second frequency; and
    logic to determine a type of defect in the interconnect based upon the first and second measurements.

16. A system for detecting a defect in an interconnect in a multi-chip module, comprising:
    means for generating a test signal having a resonant frequency, the test signal to be applied to an interconnect to test for defects;
    means for establishing a reference frequency response corresponding to a frequency response of a reference resonant circuit obtained by electrically coupling the resonant circuit to a defect free interconnect;

means for electrically coupling the resonant circuit to an interconnect to be tested for defects creating an altered resonant circuit having an altered frequency response; and means for comparing the altered frequency response with the reference frequency response to determine the existence of a defect in the interconnect.

17. The system of claim 16, further comprising means for determining the type of defect in the interconnect by comparing the altered frequency response with the reference frequency response.

18. A method for detecting a defect in an interconnect in a multi-chip module (MCM), comprising the steps of:

generating a test signal in a resonant circuit, the test signal to be applied to an interconnect to test for a defect;

determining a reference frequency response corresponding to a frequency response of a reference resonant circuit obtained by electrically coupling the resonant circuit to a defect free interconnect;

electrically coupling the resonant circuit to the interconnect to be tested for the defect creating an altered resonant circuit having an altered frequency response; and determining an existence of the defect in the interconnect by comparing the altered frequency response with the reference frequency response.

19. The method of claim 18, further comprising the step of determining a type of defect in the interconnect by comparing the altered frequency response with the reference frequency response.

20. The method of claim 18, wherein the step of determining an existence of a defect in the interconnect further comprises the step of comparing a magnitude of the reference frequency response with a magnitude of the altered frequency response at a predetermined reference frequency.

21. The method of claim 18, wherein the step of determining an existence of a defect in the interconnect comprises the step of comparing a resonant frequency of the reference resonant circuit with a resonant frequency of the altered resonant circuit.

22. The method of claim 18, further comprising the step of determining a type of defect in the interconnect by comparing a phase response of the reference resonant circuit with a phase response of the altered resonant circuit at a predetermined reference frequency.

23. The method of claim 18, further comprising the step of determining a type of defect in the interconnect by examining a difference between a resonant frequency of the reference resonant circuit and a resonant frequency of the altered resonant circuit.

24. The method of claim 18, wherein the step of generating a test signal in a resonant circuit further comprises generating the test signal in a resonant circuit having a sufficiently high quality factor, wherein the defect in the interconnect results in a detectable difference between a magnitude of the altered frequency response and a magnitude of the reference frequency response at a predetermined reference frequency.

25. The method of claim 18, wherein the step of determining a reference frequency response of the resonant circuit further comprises the step of creating the reference resonant circuit by applying the test signal to a defect free interconnect.

26. The method of claim 18, wherein the step of determining a reference frequency response of the resonant circuit further comprises the step of calculating the reference frequency response of the reference resonant circuit.

* * * * *

UNITED STATES PATENT AND TRADEMARK OFFICE
CERTIFICATE OF CORRECTION

PATENT NO. : 6,111,414
DATED : August 29, 2000
INVENTOR(S) : Abijit Chatterjee, Bruce Kim and Madhavan Swaminathan It is certified that error appears in the above-indentified patent and that said Letters Patent is hereby corrected as shown below:

Title page,

"OTHER PUBLICATIONS," in "Microelectronic (Sedra/Smith Fourth Editions) pp. 909-910 1993 (No Month Available)", delete "1993", and insert -- 1998 --

Column 4, line 5, after "probe", delete "103", and insert -- 106 --

Column 4, line 7, after "output", delete "VOUT", and insert -- $V_{OUT}$ --

Column 4, line 27, after "inductance", delete "LE", and insert -- $L_E$ --

Column 4, line 42, after "conditions", insert -- of --

Column 6, line 5 after "magnitude.", delete "1 5"

Column 6, line 8 after "$\omega_{REF}$", insert -- , --

Column 6, line 28, after "with", delete "MR," and insert -- $M_R$ --

Column 6, line 58, after "allows", delete "the"

Column 7, line 43, after "$\omega_{T1}$", delete "." and insert -- , --

Column 7, line 62, after "$\omega_{T2}$", insert -- , --

Column 8, line 3, after "or", delete "Co", and insert -- $\omega_{OPEN}$ --

UNITED STATES PATENT AND TRADEMARK OFFICE
CERTIFICATE OF CORRECTION

PATENT NO. : 6,111,414
DATED : August 29, 2000
INVENTOR(S) : Abijit Chatterjee, Bruce Kim and Madhavan Swaminathan It is certified that error appears in the above-indentified patent and that said Letters Patent is hereby corrected as shown below:

Column 8, line 4, delete "OPEN"

Column 8, line 45, after "(FIG. 5)", insert -- , --

Signed and Sealed this

Tenth Day of April, 2001

*Attest:*

NICHOLAS P. GODICI

*Attesting Officer*     *Acting Director of the United States Patent and Trademark Office*